(12) United States Patent
Nitta et al.

(10) Patent No.: US 9,425,197 B2
(45) Date of Patent: Aug. 23, 2016

(54) SEMICONDUCTOR DEVICE AND MANUFACTURING METHOD FOR THE SAME

(71) Applicant: SEIKO EPSON CORPORATION, Tokyo (JP)

(72) Inventors: Hiroaki Nitta, Sakata (JP); Hideyuki Akanuma, Minowa-machi (JP); Kazunobu Kuwazawa, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/669,714

(22) Filed: Mar. 26, 2015

(65) Prior Publication Data

US 2015/0287726 A1 Oct. 8, 2015

(30) Foreign Application Priority Data

Apr. 4, 2014 (JP) ................................ 2014-077928

(51) Int. Cl.
  *H01L 27/092* (2006.01)
  *H01L 21/8238* (2006.01)
(52) U.S. Cl.
  CPC ...... *H01L 27/0922* (2013.01); *H01L 21/82385* (2013.01); *H01L 21/823807* (2013.01); *H01L 21/823814* (2013.01)

(58) Field of Classification Search
  CPC .................. H01L 27/0922; H01L 21/823807
  USPC ........................................... 257/338
  See application file for complete search history.

(56) References Cited

U.S. PATENT DOCUMENTS

| 8,022,477 | B2 | 9/2011 | Akagi et al. |
| 2007/0212842 | A1 | 9/2007 | Maekawa |
| 2010/0001342 | A1* | 1/2010 | Furuhata et al. ............... 257/338 |

FOREIGN PATENT DOCUMENTS

| JP | H07-221291 A | 8/1995 |
| JP | H10-200123 A | 7/1998 |
| JP | 2005-093456 A | 4/2005 |
| JP | 2007-243117 A | 9/2007 |
| JP | 2008-235592 A | 10/2008 |

* cited by examiner

*Primary Examiner* — Theresa T Doan
(74) *Attorney, Agent, or Firm* — Oliff PLC

(57) ABSTRACT

A semiconductor device includes a P-channel DMOS transistor provided with an N-type gate electrode, a P-channel MOS transistor provided with a P-type gate electrode, and an N-channel MOS transistor provided with an N-type gate electrode. The N-type gate electrode of the P-channel DMOS transistor desirably has a first end portion that is located on a source side of the P-channel DMOS transistor, a second end portion that is located on a drain side of the P-channel DMOS transistor, and a P-type diffusion layer at the first end portion.

2 Claims, 5 Drawing Sheets

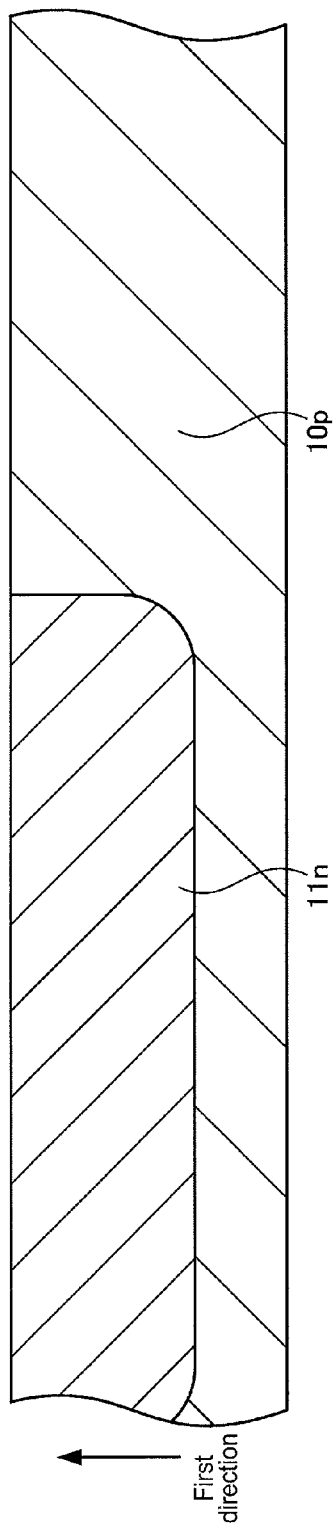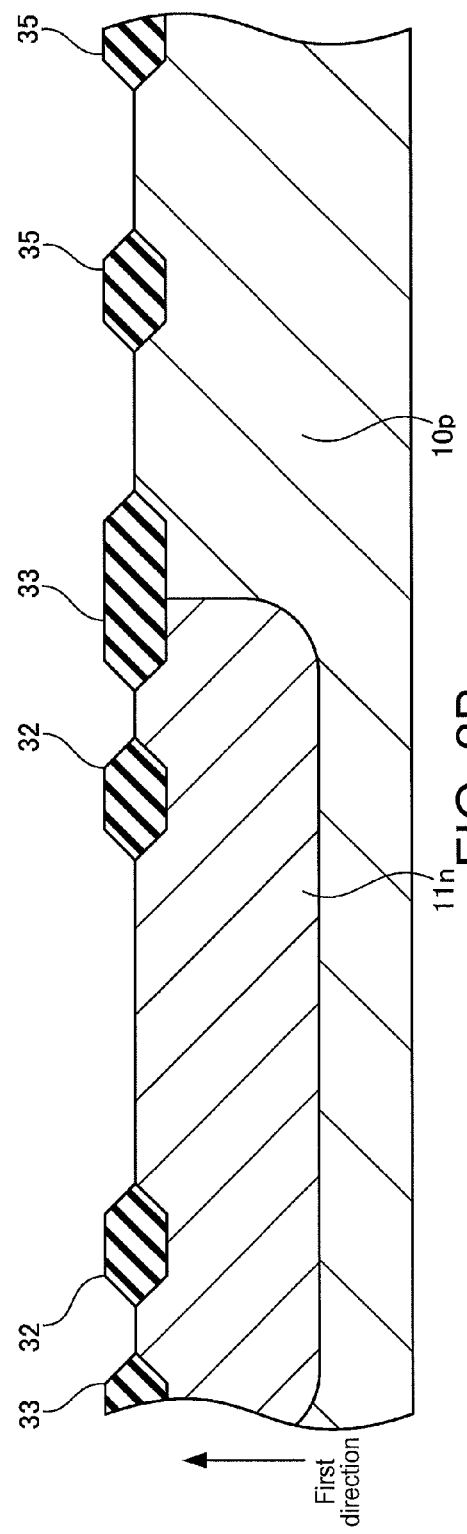

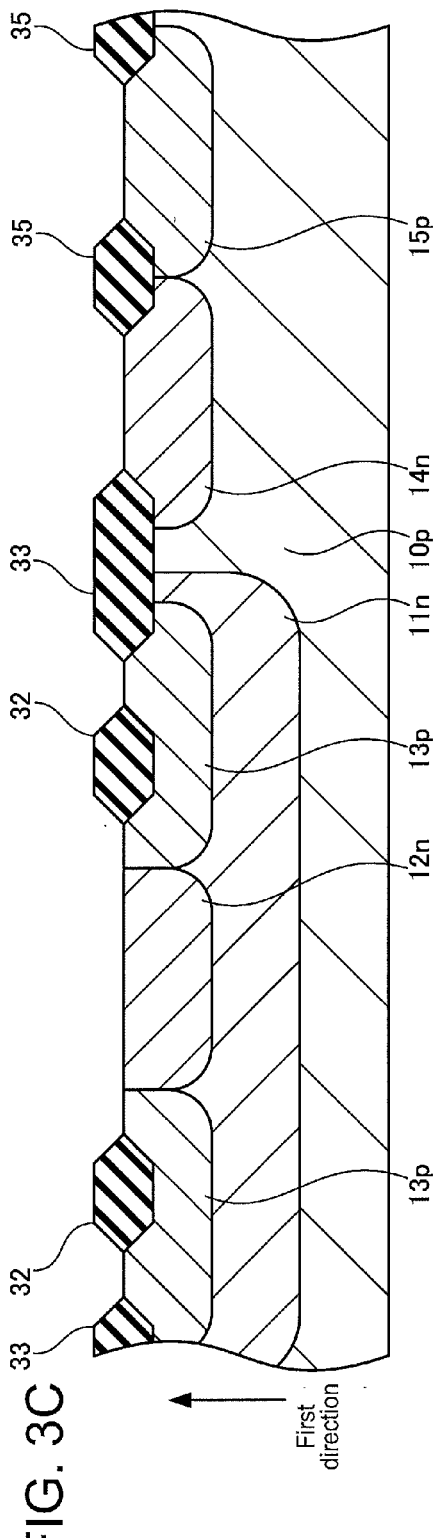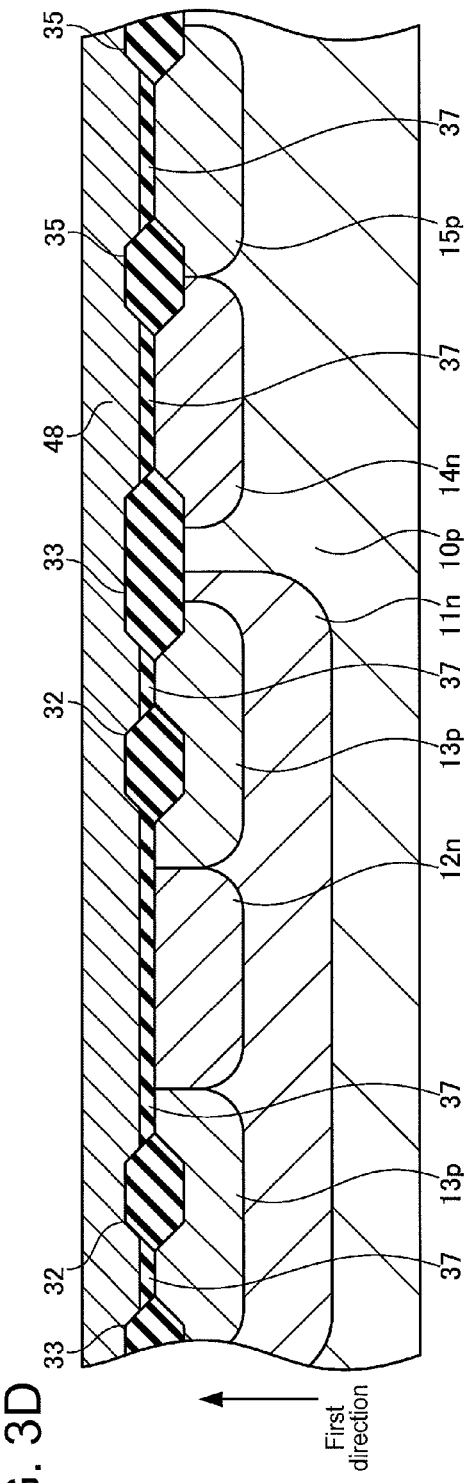

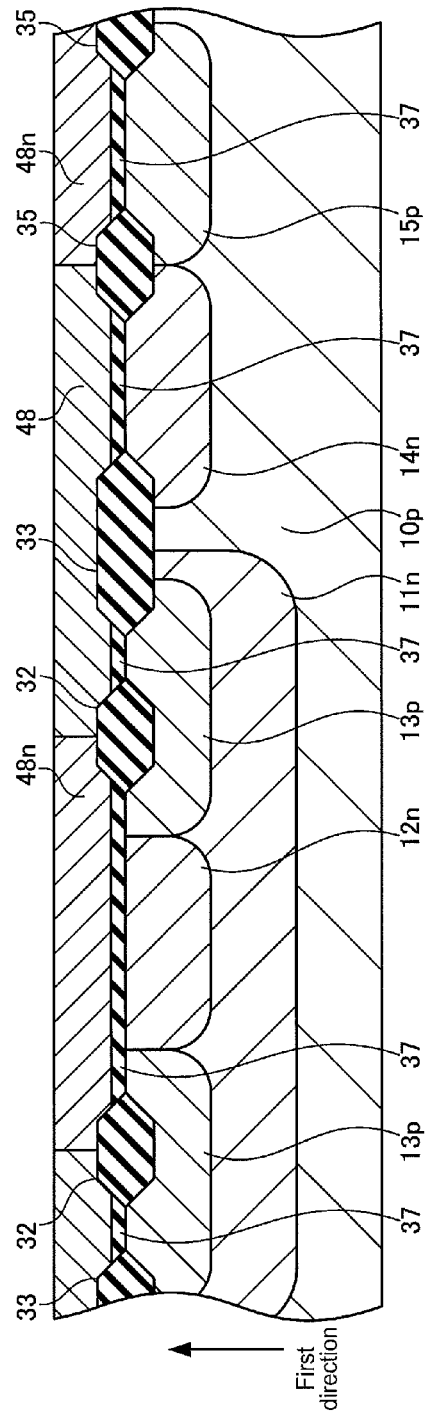
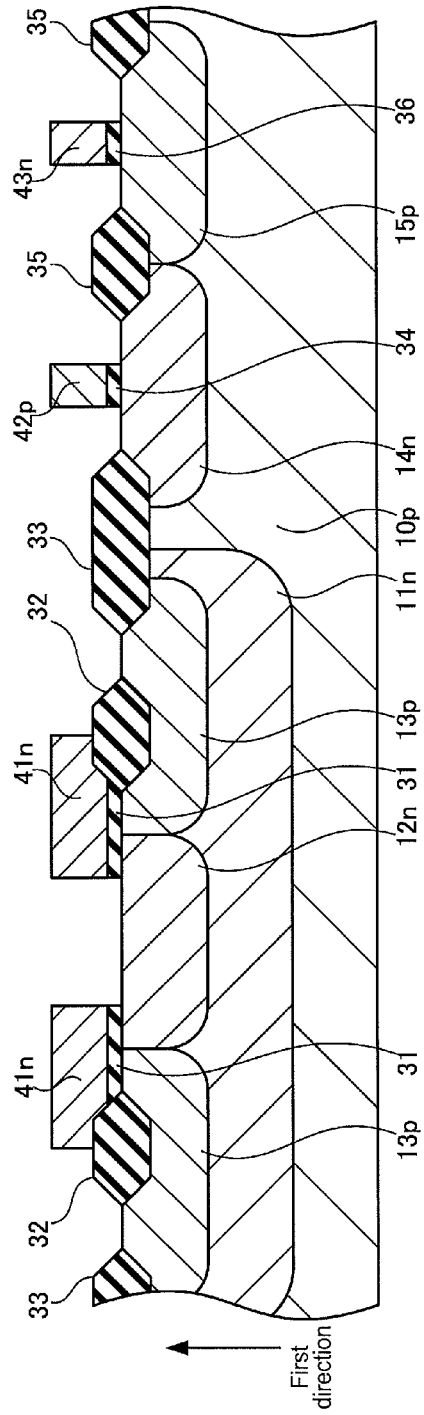

SEMICONDUCTOR DEVICE AND MANUFACTURING METHOD FOR THE SAME

BACKGROUND

1. Technical Field

The present invention relates to a semiconductor device and a manufacturing method for the same.

2. Related Art

DMOS (Double diffused Metal Oxide Semiconductor) transistors have, in the case of P-channel DMOS transistors, for example, a structure in which a low concentration N-type well region that is located in the surface of a semiconductor substrate on a first direction side and a high concentration P-type source region that is located in the surface of the N-type well region on the first direction side are formed by double diffusion. These DMOS transistors can handle high power and have characteristics such as a fast switching speed.

The main carriers in a P-channel DMOS transistor are positive holes, which have low mobility compared to electrons which are the main carriers in an N-channel DMOS transistor. P-channel DMOS transistors may thus have a high on-resistance compared to N-channel DMOS transistors. By, however, using a semiconductor containing N-type impurities as the gate electrode, the channel of a P-channel DMOS transistor is formed as a buried channel, and on-resistance can be reduced. JP-A-2008-235592 (FIG. 10) discloses the use of a semiconductor containing N-type impurities as the gate electrode of a P-channel DMOS transistor.

It is conceivable to provide a P-channel DMOS transistor having such an N-type gate electrode together with a logic circuit that is used with the P-channel DMOS transistor. In this case, it is conceivable to use a P-channel MOS transistor provided with an N-type gate electrode and an N-channel MOS transistor provided with an N-type gate electrode as MOS transistors constituting the logic circuit. That is, it is conceivable for the gate electrodes of the DMOS transistor and MOS transistors to all be configured as N-type gate electrodes.

However, while the channel of a P-channel MOS transistor provided with an N-type gate electrode is formed as a buried channel and on-resistance is reduced, there is also a tendency for leakage current below the threshold voltage to occur. Thus, P-channel MOS transistors provided with N-type gate electrodes may not be preferable as MOS transistors constituting the logic circuit.

SUMMARY

Some aspects of the invention relate to reducing leakage current in a MOS transistor together with reducing on-resistance in a DMOS transistor.

In some aspects of the invention, a semiconductor device includes a P-channel DMOS transistor provided with an N-type gate electrode, a P-channel MOS transistor provided with a P-type gate electrode, and an N-channel MOS transistor provided with an N-type gate electrode.

According to this aspect, configuring the gate electrode of the P-channel DMOS transistor as an N-type gate electrode and the gate electrode of the P-channel MOS transistor as a P-type gate electrode enables leakage current in the MOS transistor to be reduced together with reducing on-resistance in the DMOS transistor.

In the abovementioned aspect, the N-type gate electrode of the P-channel DMOS transistor desirably has a first end portion that is located on a source side of the P-channel DMOS transistor, a second end portion that is located on a drain side of the P-channel DMOS transistor, and a P-type diffusion layer at the first end portion.

Accordingly, a P-channel DMOS transistor in which P-type impurities are reliably implanted into the source region can be realized.

In the abovementioned aspect, the P-type diffusion layer is desirably located away from a gate insulating film in a thickness direction of the N-type gate electrode.

Accordingly, the channel of the DMOS transistor can be formed as a buried channel and on-resistance can be reduced.

In another aspect of the invention, a method for manufacturing a semiconductor device includes (a) forming an N-type gate electrode on a first direction side of an insulating film that is located in contact with a portion of a first N-type region and a portion of a first P-type region that are located on a surface of a semiconductor substrate on the first direction side, and (b) forming a P-type diffusion layer in a first region that is a portion of a surface of the N-type gate electrode on the first direction side and forming a source region in a second region that is a portion of a surface of the first N-type region on the first direction side, by implanting P-type impurities in a region extending across the first region and the second region.

According to this aspect, P-type impurities can be reliably implanted into the source region of the P-channel DMOS transistor.

In the abovementioned aspect, the method for manufacturing a semiconductor device desirably further includes, between (a) and (b), (c) forming a resist in a region extending across a surface of the first region on the first direction side and a surface of the second region on the first direction side, implanting N-type impurities into a third region that is a portion of the surface of the N-type gate electrode on the first direction side and differs from the first region, and into a fourth region that is a portion of the surface of the first N-type region on the first direction side and differs from second region, and removing the resist.

Accordingly, implantation of N-type impurities into the source region can be suppressed when implanting N-type impurities into the surface of the N-type gate electrode on the first direction side.

In the abovementioned aspect, (b) desirably further includes forming a source region and a drain region of the P-channel MOS transistor.

Accordingly, the source region and the drain region of the P-channel MOS transistor can be formed at the same time as the source region of the P-channel DMOS transistor.

In the abovementioned aspect, (c) desirably further includes forming a source region and a drain region of the N-channel MOS transistor.

Accordingly, the source region and the drain region of the N-channel MOS transistor can be formed at the same time as the N-type diffusion layer of the N-type gate electrode.

BRIEF DESCRIPTION OF THE DRAWINGS

The invention will be described with reference to the accompanying drawings, wherein like numbers reference like elements.

FIGS. 2A and 2B are cross-sectional views showing a method for manufacturing the semiconductor device according to the embodiment.

FIGS. 3C and 3D are cross-sectional views showing the method for manufacturing the semiconductor device according to the embodiment.

FIGS. 4E and 4F are cross-sectional views showing the method for manufacturing the semiconductor device according to the embodiment.

DESCRIPTION OF EXEMPLARY EMBODIMENTS

Hereinafter, embodiments of the invention will be described in detail. Note that the embodiments described below are not intended to unduly limit the scope of the invention as defined in the claims, and not all configurations that are described in the embodiments are essential to means for solving the problems addressed by the invention. Also, the same reference signs are given to constituent elements that are the same, and description thereof will be omitted.

1. Configuration

Figure 1A:
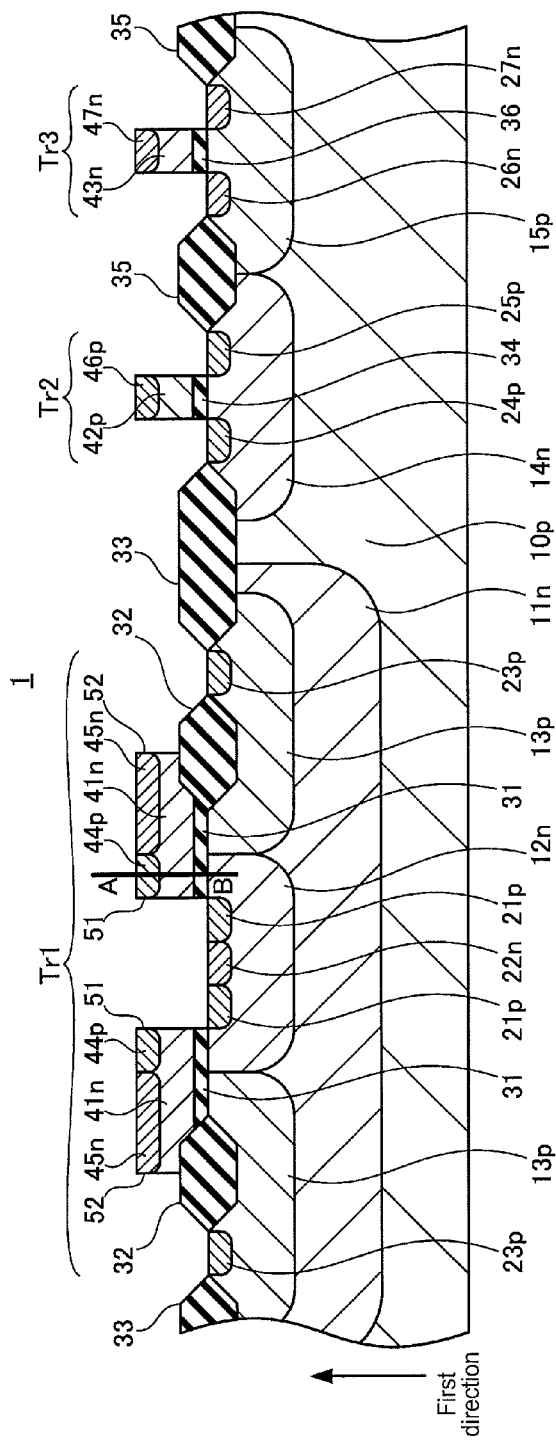
FIGS. 1A and 1B are a cross-sectional view of a semiconductor device according to an embodiment and a graph showing an impurity concentration distribution.

FIG. 1A is a cross-sectional view showing an exemplary semiconductor device according to an embodiment of the invention.

A semiconductor device 1 that is shown in FIG. 1A includes a P-channel DMOS transistor Tr1, a P-channel MOS transistor Tr2, and an N-channel MOS transistor Tr3. These transistors are all located on a surface of a P-type semiconductor substrate 10p on a first direction side. The first direction side is equivalent to the upper side in the drawings. The semiconductor substrate 10p is constituted by monocrystalline silicon containing P-type impurities.

1-1. P-Channel DMOS Transistor Tr1

Because the P-channel DMOS transistor Tr1 has a symmetrical structure as shown in FIG. 1A, the same reference signs are given to elements that correspond on the left side and right side, and redundant description will be omitted. At the position of the P-channel DMOS transistor Tr1 in the semiconductor substrate 10p are located an N-type well 11n, an N-type body region 12n, a P-type offset region 13p, a P-type source region 21p, a N-type body contact region 22n, and a P-type drain region 23p.

The N-type well 11n contains N-type impurities. The N-type well 11n is located in contact with the surface of the semiconductor substrate 10p on the first direction side. The N-type body region 12n contains N-type impurities at a higher concentration than the N-type well 11n. The N-type body region 12n is located inside the N-type well 11n, in contact with the surface of the semiconductor substrate 10p on the first direction side. The P-type offset region 13p contains P-type impurities. The P-type offset region 13p is located inside the N-type well 11n, on both the left and right sides of the N-type body region 12n, in contact with the surface of the semiconductor substrate 10p on the first direction side.

The P-type source region 21p contains P-type impurities, and the N-type body contact region 22n contains N-type impurities at a higher concentration than the N-type body region 12n. The P-type source region 21p and the N-type body contact region 22n are located inside the N-type body region 12n, in contact with the surface of the semiconductor substrate 10p on the first direction side. The P-type drain region 23p contains P-type impurities at a higher concentration than the P-type offset region 13p. The P-type drain region 23p is located inside the P-type offset region 13p, in contact with the surface of the semiconductor substrate 10p on the first direction side.

On the first direction side of the semiconductor substrate 10p are located a first insulating film 31, a second insulating film 32, a third insulating film 33, and an N-type gate electrode 41n.

The third insulating film 33 is provided along an outer perimeter of the N-type well 11n. The third insulating film 33 is formed by a LOCOS (Local Oxidization of Silicon) method, for example. The P-channel DMOS transistor Tr1 is separated from other elements of the semiconductor substrate 10p by the third insulating film 33 and the N-type well 11n.

The N-type gate electrode 41n is provided in a region extending across the first direction side of the N-type body region 12n and the first direction side of the P-type offset region 13p. The first insulating film 31 and the second insulating film 32 are located between the N-type gate electrode 41n and the semiconductor substrate 10p.

The first insulating film 31 is in a position on the N-type body region 12n side of the region between the N-type gate electrode 41n and the semiconductor substrate 10p. The first insulating film 31 functions as a gate insulating film.

The second insulating film 32 is in a position on the P-type offset region 13p side of the region between the N-type gate electrode 41n and the semiconductor substrate 10p. The second insulating film 32 functions to relax the electric field between the N-type gate electrode 41n and the P-type drain region 23p, by having a greater film thickness than the first insulating film 31.

The N-type gate electrode 41n is constituted by polycrystalline silicon containing N-type impurities. The N-type gate electrode 41n has a first end portion 51 that is located on a source side and a second end portion 52 that is located on a drain side.

A P-type diffusion layer 44p is located at the first end portion 51 of the N-type gate electrode 41n. The P-type diffusion layer 44p contains P-type impurities. The P-type diffusion layer 44p is located away from the first insulating film 31 in a thickness direction of the N-type gate electrode 41n. The thickness direction of the N-type gate electrode 41n substantially coincides with the first direction. Also, the P-type diffusion layer 44p is located in contact with the surface of the N-type gate electrode 41n on the first direction side.

An N-type diffusion layer 45n is also located at the surface of the N-type gate electrode 41n on the first direction side. The N-type diffusion layer 45n contains N-type impurities at a higher concentration than other portions of the N-type gate electrode 41n. The N-type diffusion layer 45n spans from a position contacting the P-type diffusion layer 44p to the position of the second end portion 52 of the N-type gate electrode 41n.

Figure 1B:
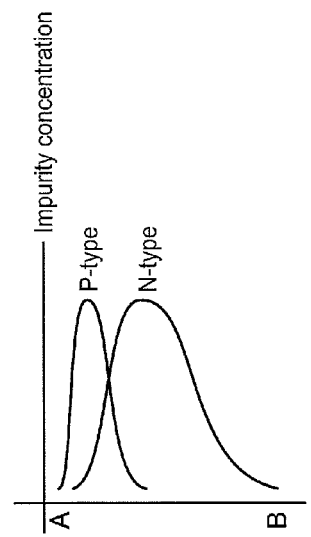

FIG. 1B is a graph showing the concentration distribution of impurities along an A-B line in FIG. 1A. In the vicinity of the first end portion 51 of the N-type gate electrode 41n, P-type impurities are included at a high concentration in positions near the surface on the first direction side, that is, in positions away from the first insulating film 31 in the thickness direction of the N-type gate electrode 41n, and N-type impurities are included at a high concentration in positions away from the surface on the first direction side, that is, in positions near the first insulating film 31. Accordingly, although the N-type gate electrode 41n includes the P-type diffusion layer 44p in a portion thereof, the channel in the N-type body region 12n is formed as a buried channel, enabling on-resistance to be reduced.

1-2. P-Channel MOS Transistor Tr2

Referring again to FIG. 1A, at the position of the P-channel MOS transistor Tr2 in the semiconductor substrate 10p are located an N-type well 14n, a P-type source region 24p, and a P-type drain region 25p.

The N-type well 14n contains N-type impurities. The N-type well 14n is located in contact with the surface of the semiconductor substrate 10p on the first direction side.

The P-type source region 24p and the P-type drain region 25p contain P-type impurities. The P-type source region 24p and the P-type drain region 25p are located inside the N-type well 14n, in contact with the surface of the semiconductor substrate 10p on the first direction side, and with an interval therebetween.

On the first direction side of the semiconductor substrate 10p are located a fourth insulating film 34, a fifth insulating film 35, and a P-type gate electrode 42p. The fifth insulating film 35 is formed by the LOCOS method, for example. The P-channel MOS transistor Tr2 is separated from other elements of the semiconductor substrate 10p by the third insulating film 33, the fifth insulating film 35, and the N-type well 14n.

The fourth insulating film 34 is located in contact with the region that is sandwiched between the P-type source region 24p and the P-type drain region 25p and forms the surface of the semiconductor substrate 10p on the first direction side. The fourth insulating film 34 functions as a gate insulating film.

The P-type gate electrode 42p is located in contact with the surface of the fourth insulating film 34 on the first direction side. The P-type gate electrode 42p is constituted by polycrystalline silicon containing P-type impurities. A P-type diffusion layer 46p is located at the surface of the P-type gate electrode 42p on the first direction side. The P-type diffusion layer 46p contains P-type impurities at a higher concentration than other portions of the P-type gate electrode 42p. The P-type gate electrode 42p suppresses formation of the channel in the N-type well 14n as a buried channel, enabling leakage current below the threshold voltage to be reduced.

1-3. N-Channel MOS Transistor Tr3

At the position of the N-channel MOS transistor Tr3 in the semiconductor substrate 10p are located a P-type well 15p, an N-type source region 26n, and an N-type drain region 27n.

The P-type well 15p contains P-type impurities. The P-type well 15p is located in contact with the surface of the semiconductor substrate 10p on the first direction side.

The N-type source region 26n and the N-type drain region 27n contain N-type impurities. The N-type source region 26n and the N-type drain region 27n are located inside the P-type well 15p, in contact with the surface of the semiconductor substrate 10p on the first direction side, and with an interval therebetween.

On the first direction side of the semiconductor substrate 10p are located the fifth insulating film 35, a sixth insulating film 36, and an N-type gate electrode 43n. The N-channel MOS transistor Tr3 is separated from other elements of the semiconductor substrate 10p by the fifth insulating film 35 and the P-type well 15p.

The sixth insulating film 36 is located in contact with the region that is sandwiched between the N-type source region 26n and the N-type drain region 27n and forms the surface of the semiconductor substrate 10p on the first direction side. The sixth insulating film 36 functions as a gate insulating film.

The N-type gate electrode 43n is located in contact with the surface of the sixth insulating film 36 on the first direction side. The N-type gate electrode 43n is constituted by polycrystalline silicon containing N-type impurities. An N-type diffusion layer 47n is located at the surface of the N-type gate electrode 43n on the first direction side. The N-type diffusion layer 47n contains N-type impurities at a higher concentration than other portions of the N-type gate electrode 43n. A logic circuit is constituted by combining the P-channel MOS transistor Tr2 and the N-channel MOS transistor Tr3.

2. Manufacturing Method

FIGS. 2 to 5 are cross-sectional views showing a method for manufacturing the semiconductor device according to the embodiment of the invention. First, as shown in FIG. 2A, the N-type well 11n is formed in the surface of the P-type semiconductor substrate 10p on the first direction side.

Next, as shown in FIG. 2B, the second insulating film 32, the third insulating film 33 and the fifth insulating film 35 are formed by the LOCOS method, for example, at predetermined places on the surface of the semiconductor substrate 10p on the first direction side.

Next, as shown in FIG. 3C, the N-type body region 12n and the N-type well 14n are formed, by implanting N-type impurities into the surface of the semiconductor substrate 10p on the first direction side. Also, the P-type offset region 13p and the P-type well 15p are formed, by implanting P-type impurities into the surface of the semiconductor substrate 10p on the first direction side. The N-type body region 12n is equivalent to a first N-type region according to the invention, and the P-type offset region 13p is equivalent to a first P-type region according to the invention.

Next, as shown in FIG. 3D, a thin insulating film 37 that will form the gate insulating films is formed on the surface of the semiconductor substrate 10p on the first direction side. Furthermore, a polycrystalline silicon layer 48 that will form the gate electrodes is formed on the surface of the insulating film 37 on the first direction side.

Next, as shown in FIG. 4E, N-type impurities are implanted into portions of the polycrystalline silicon layer 48 that will form the N-type gate electrode 41n and the N-type gate electrode 43n to form N-type regions 48n. Note that P-type impurities may be implanted into a portion of the polycrystalline silicon layer 48 that will form the P-type gate electrode 42p, but need not necessarily be implanted.

Next, as shown in FIG. 4F, a portion of the polycrystalline silicon layer 48 and a portion of the insulating film 37 are removed through etching. The N-type gate electrode 41n, the P-type gate electrode 42p, the N-type gate electrode 43n, the first insulating film 31, the fourth insulating film 34 and the sixth insulating film 36 are thereby formed.

Figure 5G:
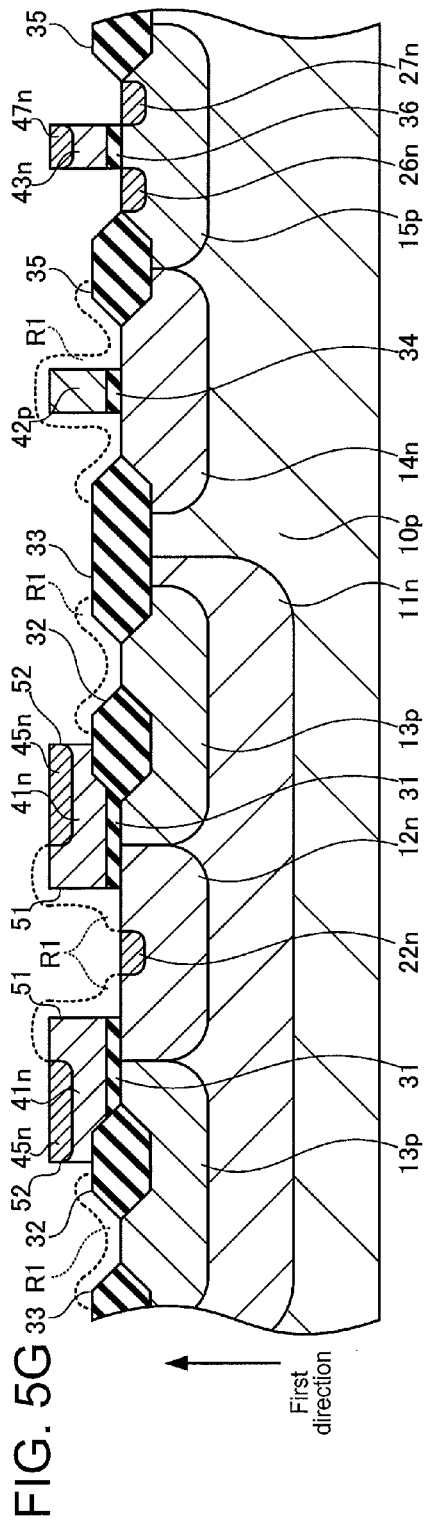
FIGS. 5G and 5H are cross-sectional views showing the method for manufacturing the semiconductor device according to the embodiment.

Next, as shown in FIG. 5G, N-type impurities are implanted into respective positions, in order to form the N-type body contact region 22n in the N-type body region 12n, and form the N-type diffusion layer 45n in the N-type gate electrode 41n.

At this time, a resist R1 is formed such that N-type impurities do not enter a portion that will form the P-type source region 21p. The resist R1 is formed in a region extending across a portion of the N-type body region 12n and a portion of the N-type gate electrode 41n, so as to cover not only the portion that will form the P-type source region 21p but also the first end portion 51 that is located on the source side of the N-type gate electrode 41n. The N-type body contact region 22n is formed in a position that is equivalent to a fourth region according to the invention, and the N-type diffusion layer 45n is formed in a position that is equivalent to a third region according to the invention.

Also, the N-type source region 26n, the N-type drain region 27n and the N-type diffusion layer 47n of the N-channel MOS transistor Tr3 are desirably formed, as shown in FIG. 5G, at the same time as this process. Thereafter, the resist R1 is removed.

Figure 5H:
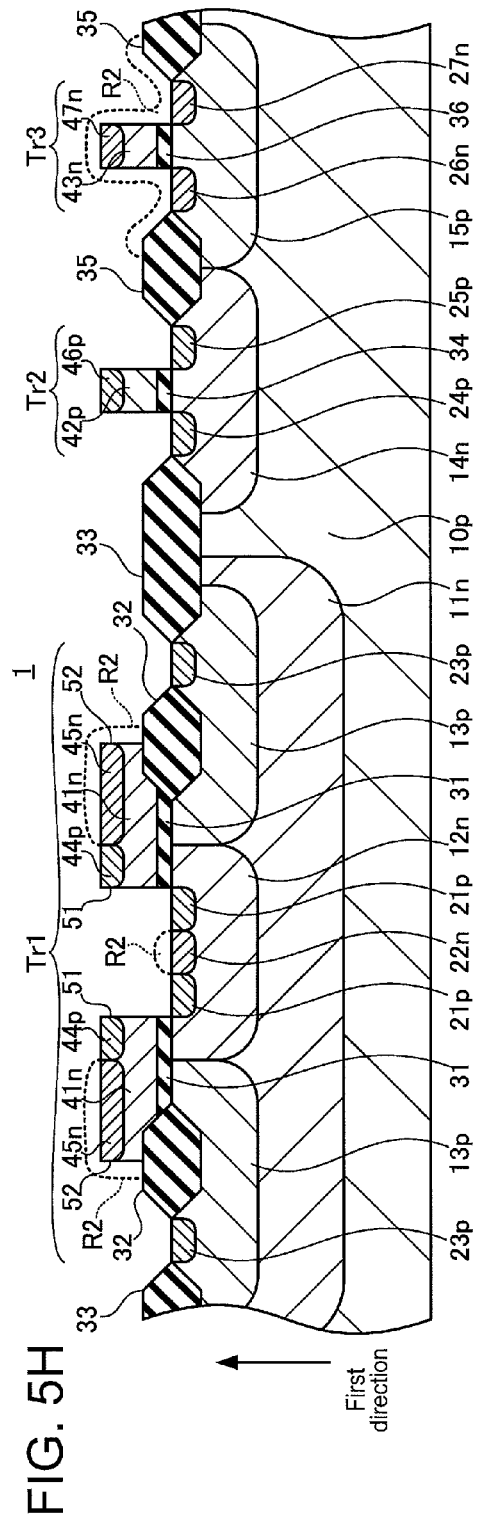

Next, as shown in FIG. 5H, P-type impurities are implanted into respective positions, in order to form the P-type source region 21p in the N-type body region 12n, and form the P-type drain region 23p in the P-type offset region 13p.

The resist R2 that is formed at this time does not completely cover the N-type gate electrode 41n, and the first end portion 51 that is located on the source side of the N-type gate electrode 41n is left exposed. P-type impurities are thereby implanted in a region extending across the portion that will form the P-type source region 21p and the first end portion 51 that is located on the source side of the N-type gate electrode 41n. The P-type diffusion layer 44p is formed in the vicinity of the first end portion 51 that is located on the source side of the N-type gate electrode 41n. The portion that will form the P-type source region 21p is equivalent to a second region according to the invention, and the vicinity of the first end portion 51 that is located on the source side of the N-type gate electrode 41n is equivalent to a first region according to the invention.

Also, the P-type source region 24p, the P-type drain region 25p and the P-type diffusion layer 46p of the P-channel MOS transistor Tr2 are desirably formed, as shown in FIG. 5H, at the same time as this process. Thereafter, the resist R2 is removed.

The semiconductor device 1 can be manufactured by the above processes.

In the embodiment described above, a P-type well containing P-type impurities may be provided instead of the N-type well 11n.

The entire disclosure of Japanese Patent Application No. 2014-077928, filed Apr. 4, 2014 is expressly incorporated by reference herein.

What is claimed is:

1. A semiconductor device comprising:
 a P-channel DMOS transistor provided with an N-type gate electrode;
 a P-channel MOS transistor provided with a P-type gate electrode; and
 an N-channel MOS transistor provided with an N-type gate electrode,
 wherein the N-type gate electrode of the P-channel DMOS transistor has a first end portion that is located on a source side of the P-channel DMOS transistor, a second end portion that is located on a drain side of the P-channel DMOS transistor, and a P-type diffusion layer at the first end portion.

2. The semiconductor device according to claim 1, wherein the P-type diffusion layer is located away from a gate insulating film in a thickness direction of the N-type gate electrode.

* * * * *